(12) United States Patent
Huang et al.

(10) Patent No.: US 6,469,548 B1
(45) Date of Patent: Oct. 22, 2002

(54) OUTPUT BUFFER CROSSING POINT COMPENSATION

(75) Inventors: Wei-Jen Huang, San Jose; Kuang-Yu Chen, Saratoga, both of CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/881,354

(22) Filed: Jun. 14, 2001

(51) Int. Cl.[7] .................................................. H03B 1/00
(52) U.S. Cl. ........................ 327/108; 327/538; 327/543; 327/112
(58) Field of Search ................................ 327/538, 543, 327/103, 540, 541, 307, 108, 112, 379, 389; 323/312, 313, 315; 326/83

(56) References Cited

U.S. PATENT DOCUMENTS

| | | | |
|---|---|---|---|
| 4,336,503 A | 6/1982 | Whatley | 330/253 |
| 4,462,002 A | 7/1984 | Schade, Jr. | 330/253 |
| 4,670,706 A * | 6/1987 | Tobita | 323/313 |
| 5,212,458 A | 5/1993 | Fitzpatrick et al. | 330/288 |
| 5,223,743 A | 6/1993 | Nakagawara | 307/296.1 |
| 5,225,716 A | 7/1993 | Endo et al. | 307/296.8 |
| 5,227,714 A * | 7/1993 | Lou | 323/315 |
| 5,298,809 A | 3/1994 | Yamaguchi | 307/491 |
| 5,347,224 A | 9/1994 | Brokaw | 324/522 |
| 5,448,190 A * | 9/1995 | Etoh | 327/543 |
| 5,451,898 A | 9/1995 | Johnson | 327/563 |
| 5,485,126 A | 1/1996 | Gersbach et al. | 331/57 |
| 5,672,993 A * | 9/1997 | Runaldue | 323/315 |
| 5,767,698 A | 6/1998 | Emeigh et al. | 326/83 |
| 5,793,194 A * | 8/1998 | Lewis | 323/312 |
| 5,883,531 A | 3/1999 | Kuo | 327/108 |
| 5,905,412 A | 5/1999 | Rasmussen | 331/57 |
| 5,939,933 A * | 8/1999 | Wang | 323/315 |
| 5,940,448 A | 8/1999 | Kuo | 375/316 |
| 6,114,901 A * | 9/2000 | Singh et al. | 327/543 |
| 6,166,566 A | 12/2000 | Strong | 327/72 |
| 6,172,556 B1 * | 1/2001 | Prentice | 327/543 |
| 6,175,267 B1 | 1/2001 | Bree et al. | 327/541 |
| 6,255,897 B1 * | 7/2001 | Klemmer | 327/538 |

* cited by examiner

*Primary Examiner*—Terry D. Cunningham
*Assistant Examiner*—Long Nguyen
(74) *Attorney, Agent, or Firm*—Christopher P. Maiorana, P.C.; John J. Ignatowski

(57) ABSTRACT

A circuit comprising a current source, a first amplifier, and a second amplifier. The circuit may be used to provide for crossing point compensation of a CMOS driver as a function of a supply voltage. The current source may be configured to present a reference current. The first amplifier may be configured to (i) receive the reference current as a load, (ii) receive a first voltage, and (iii) present a second voltage responsive to the first voltage. The second amplifier may be configured to (i) receive the second voltage and (ii) change a current at a node responsive to the second voltage.

15 Claims, 6 Drawing Sheets

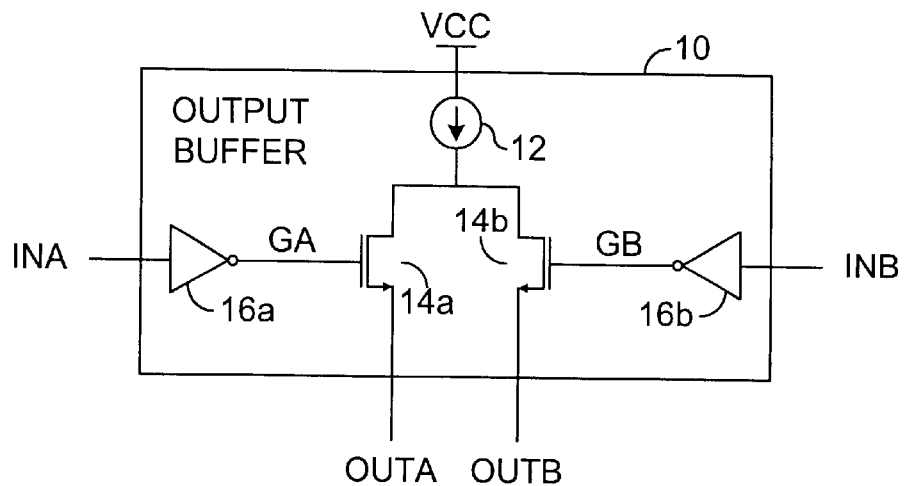
FIG. 1
(CONVENTIONAL)

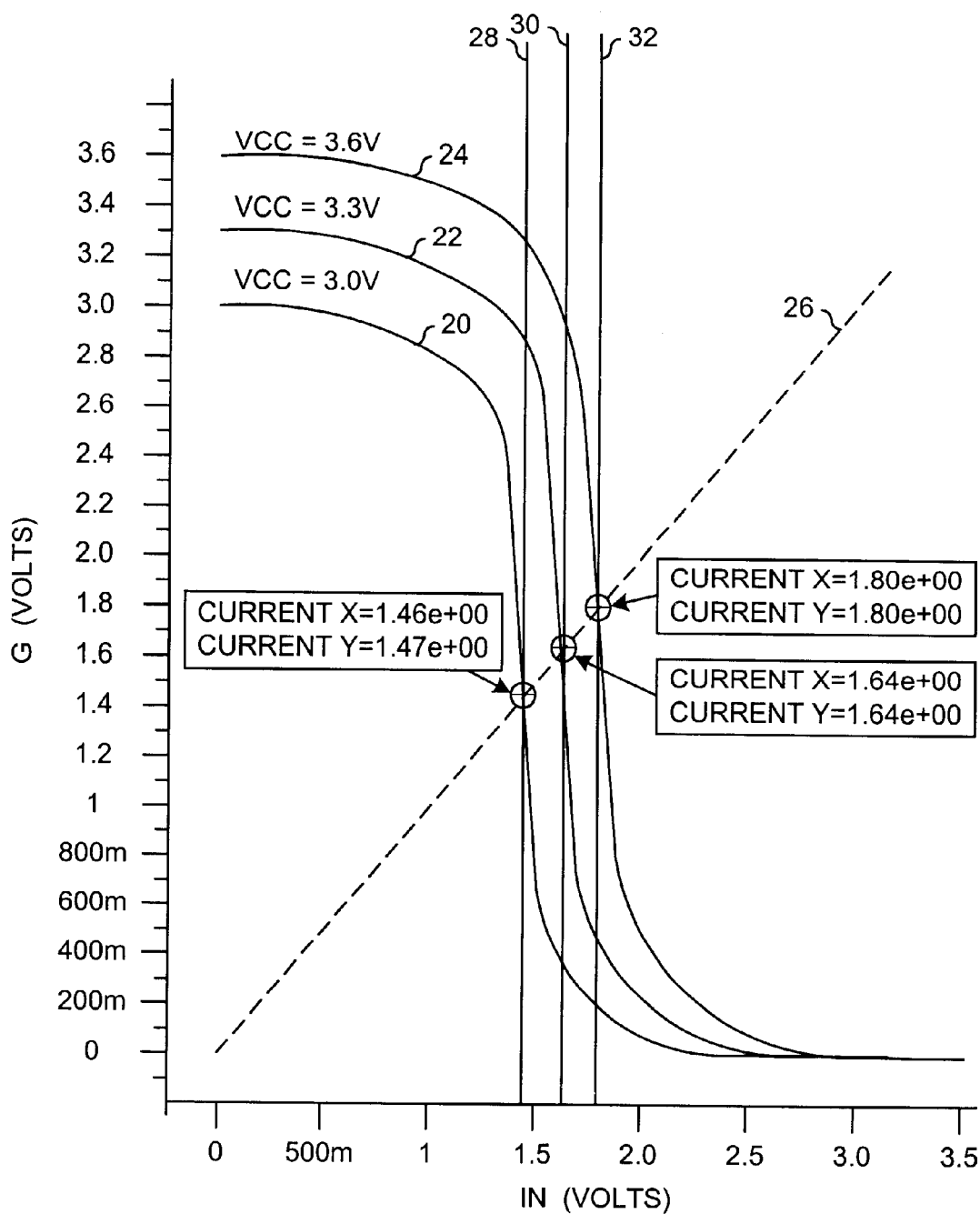
FIG. 2
(CONVENTIONAL)

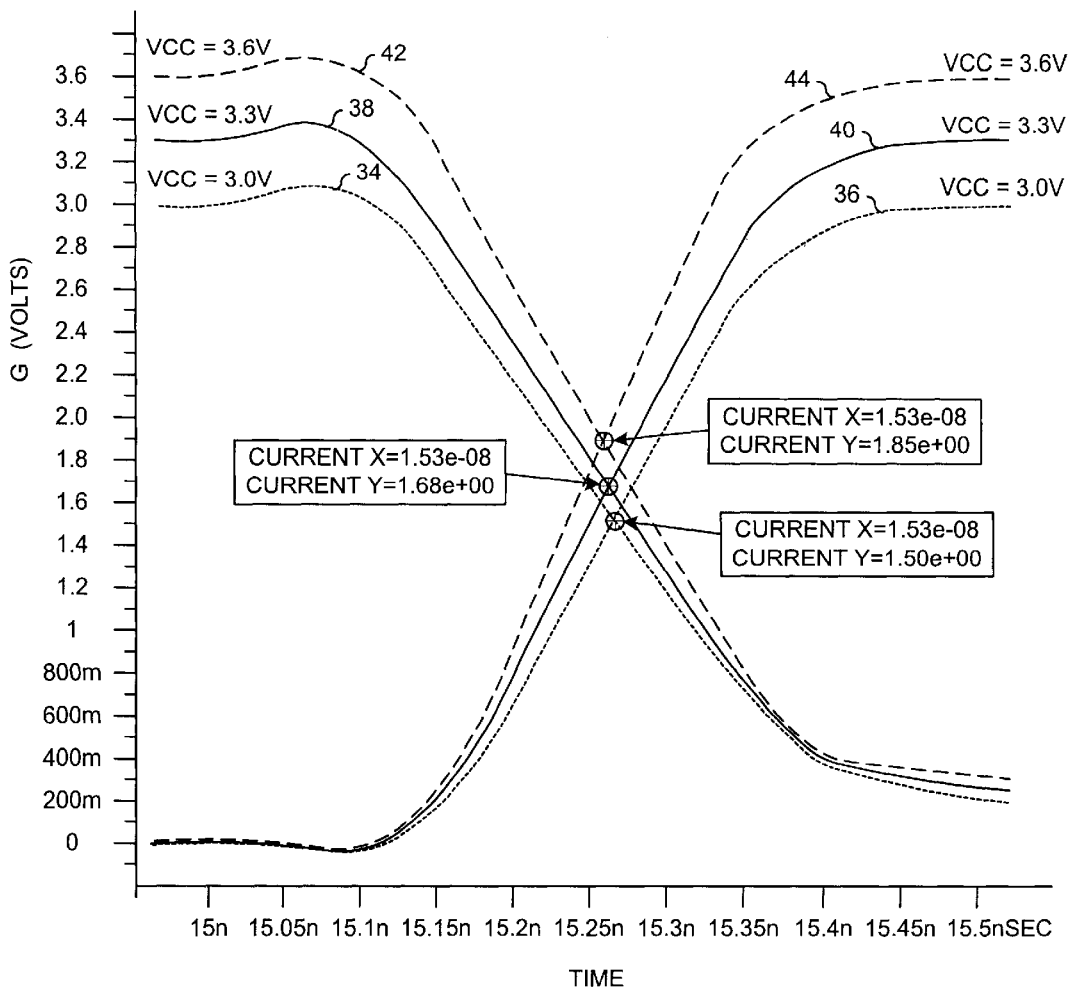
FIG. 3
(CONVENTIONAL)

US 6,469,548 B1

OUTPUT BUFFER CROSSING POINT COMPENSATION

FIELD OF THE INVENTION

The present invention relates to a method and/or architecture for output buffers generally and, more particularly, to buffer crossing point compensation for supply voltage variations.

BACKGROUND OF THE INVENTION

FIG. 1 shows a block diagram of a conventional output buffer 10 in a differential configuration. The output buffer 10 has an output current source 12 connected to a pair of output transistors 14A–B. Each of the output transistors 14A–B presents a signal (i.e., OUTA and OUTB). Each of the output transistors 14A–B has a gate driven by a pre-drive inverter 16A–B. The left pre-drive inverter 16A receives a signal (i.e., INA) and presents a signal (i.e., GA) to the gate of the left output transistor 14A. The right pre-drive inverter 16B receives a signal (i.e., IND) and present a signal (i.e., GB) to the gate of the right output transistor 14B. The signal INA and the signal INB are commonly complementary signals. Under ideal conditions, the signal GA and the signal GB will also be complementary signals. As a result, the signal OUTA and the signal OUTB will be complementary signals.

Referring to FIG. 2, a transfer characteristic of the pre-drive inverters 16A–B is shown. The pre-drive inverters 16A–B are designed to operate at a specific supply voltage (i.e., VCC) with respect to a ground voltage (i.e., GND). A curve 20 represents the transfer characteristics of the pre-drive inverters 16A–B for a supply voltage VCC (i.e., 3.0 volts). A curve 22 a represents the transfer characteristics of the pre-drive inverters 16A–B for a higher supply voltage VCC (i.e., 3.3 volts). A curve 23 represents the transfer characteristics for the pre-drive inverters 16A–B for an even higher supply voltage VCC (i.e., 3.6 volts). The curves 20, 22, and 24 are symmetrical about a line 26 where the signal IN equals the signal G. The curves 20, 22, and 24 cross-over the line 26 at different values for the signal IN as indicated by lines 28, 30, and 32 respectively. As the supply voltage VCC increases from 3.0 volts to 3.6 volts, a threshold $V_M$ of the pre-drive inverters 16A–B moves up from 1.47 volts to 1.8 volts.

Referring back to FIG. 1, the crossing point of the pre-drive inverters 16A–B moves up with increasing supply voltage VCC due to increases in the threshold $V_M$. Defining a second crossing point as that point where signal OUTA equals signal OUTB, then the second crossing point is also dependent upon the crossing point of the pre-drive inverters 16A–B. As the supply voltage VCC changes, so too will the second crossing point.

Referring to FIG. 3, transient characteristics of the pre-drive inverters 16A–B are shown. A pair of curves 34 and 36 represent step responses of the pre-drive inverters 16A–B at the supply voltage VCC of 3.0 volts. A pair of curves 38 and 40 represent step responses of the pre-drive inverters 16A–B at the supply voltage VCC of 3.3 volts. A pair of curves 42 and 44 represent step responses of the pre-drive inverters 16A–B at the supply voltage VCC of 3.6 volts. Defining a third crossing point as a time where the step-up response crosses the step-down response, then the curves 34–44 show that the third crossing point will also vary with changes in the supply voltage VCC.

SUMMARY OF THE INVENTION

The present invention concerns a circuit comprising a current source, a first amplifier, and a second amplifier. The circuit may be used to provide for crossing point compensation of a CMOS driver as a function of a supply voltage. The current source may be configured to present a reference current. The first amplifier may be configured to (i) receive the reference current as a load, (ii) receive a first voltage, and (iii) present a second voltage responsive to the first voltage. The second amplifier may be configured to (i) receive the second voltage and (ii) change a current at a node responsive to the second voltage.

The objects, features and advantages of the present invention include providing output buffer crossing point compensation that may (i) reduce and/or eliminate dependency of the crossing point upon the supply voltage and/or (ii) require a small part count to implement.

BRIEF DESCRIPTION OF THE DRAWINGS

These and other objects, features and advantages of the present invention will be apparent from the following detailed description and the appended claims and drawings in which:

FIG. 1 is a block diagram of a conventional output buffer;

FIG. 2 is a transfer characteristic of a conventional pre-drive inverter;

FIG. 3 is a transient characteristic of the conventional pre-drive inverter;

DETAILED DESCRIPTION OF THE PREFERRED EMBODIMENTS

Figure 4:
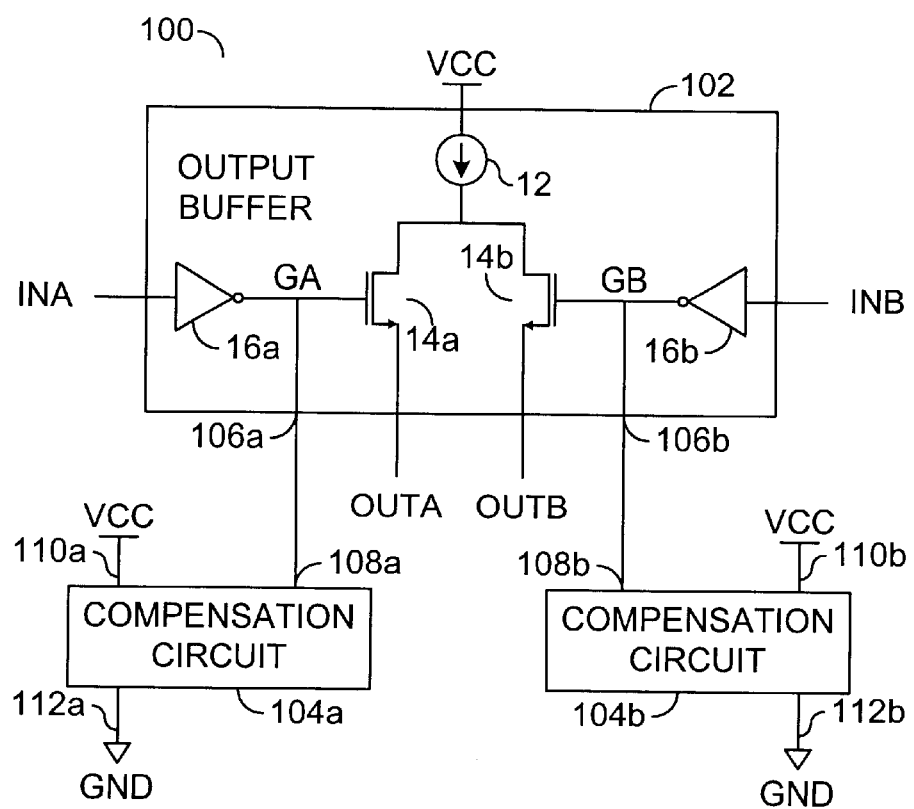
FIG. 4 is a block diagram of a circuit implementing the present invention.

Referring to FIG. 4, a block diagram of a circuit 100 is shown in accordance with a preferred embodiment of a present invention. The circuit 100 generally comprises the output buffer 102, a left compensation circuit 104A, and a right compensation circuit 104B. The output buffer 102 may be implemented as a modified version of the conventional output buffer 10 (FIG. 1). The output buffer 102 may comprise the output current source 12, the output transistors 16A–B, and the pre-drive inverters 16A–B configured as shown in FIG. 1. The modifications may include an output 106A coupled to an output of the left pre-drive inverter 16A and another output 106B coupled to an output of the right pre-drive inverter 16B.

The left compensation circuit 104A may have an output 108A connected to the output 106A of the output buffer 102 to influence the signal GA. The left compensation circuit 104A may have an input 110A to receive a supply voltage (e.g., VCC). The left compensation circuit 104A may have an input 112A to receive a ground voltage (e.g., GND). The right compensation circuit 104B may be similar to the left compensation circuit 104A. The right compensation circuit 104B may have an output 108B connected to the output 106B of the output buffer 102 to influence the signal GB. The right compensation circuit 104B may have an input 110B to receive the supply voltage VCC. The right compensation circuit 104B may have an input 112B to receive the ground voltage GND.

A function of the left compensation circuit 104A may be to draw current through the output 106A from the left pre-drive inverter 16A. The amount of current drawn by the left compensation circuit 104A may be proportional to the supply voltage VCC. As the supply voltage VCC increases, then the left compensation circuit 104A may draw increasing current from the left pre-drive inverter 16A. The effect of drawing the current from the output of the left pre-drive inverter 16A is to skew the transfer characteristic of the left pre-drive inverter 16A. The skew may be designed such that a threshold $V_M$ of the signal GA is kept constant over a range of values for the supply voltage VCC.

The right compensation circuit 104B, likewise, may draw a current through the output 106B from the right pre-drive inverter 16B. The right compensation circuit 104B may be designed to compensate the transfer characteristics of the right pre-drive inverter 16B such that the threshold $V_M$ of the signal GB is kept constant and independent of variations in the supply voltage VCC. As a result, the signal OUTA and the signal OUTB may become less dependent or independent from variations in the supply voltage VCC.

Figure 5:
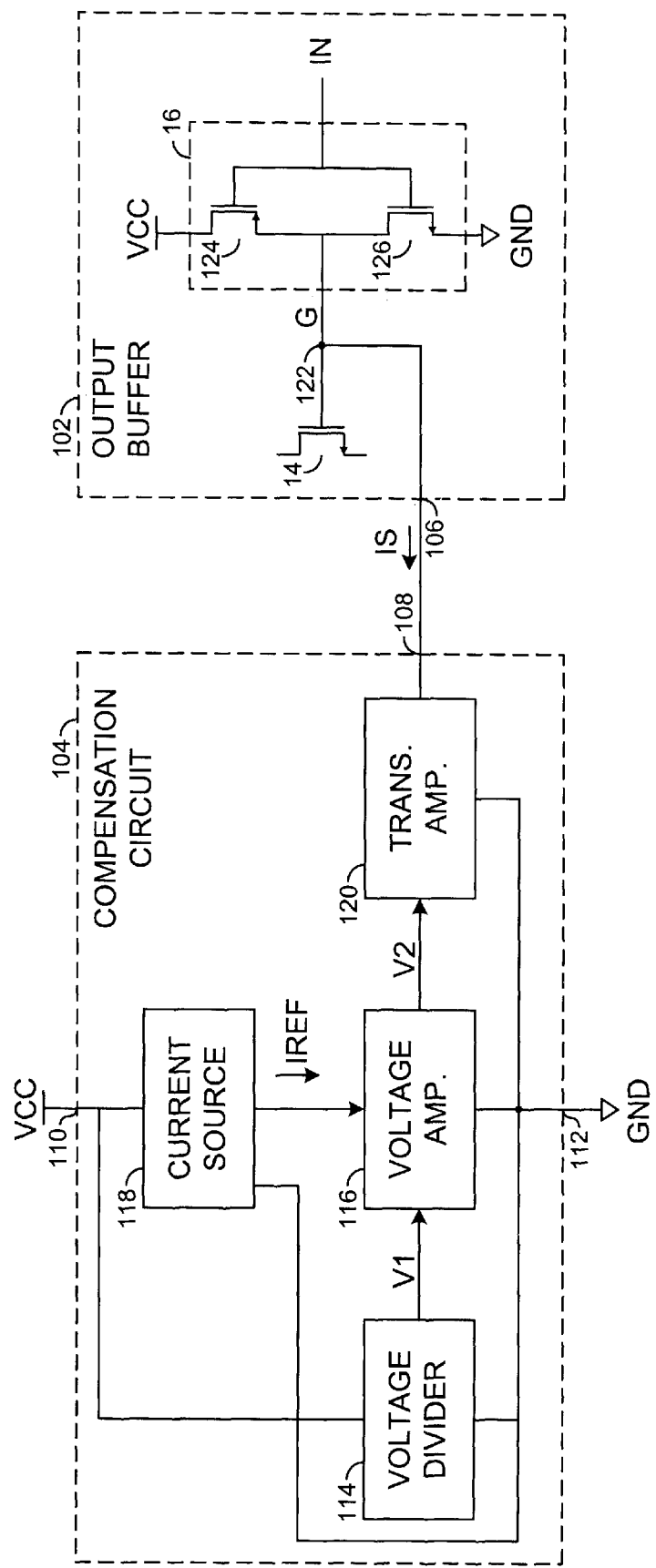
FIG. 5 is a detailed block diagram of the circuit.

Referring to FIG. 5, a detailed block diagram of the compensation circuit 104 is shown. The compensation circuit 104 generally comprises a circuit 114, a circuit 116, a circuit 118, and a circuit 120. The circuit 114 may be implemented as a voltage divider. The circuit 116 may be implemented as a voltage amplifier. The circuit 118 may be implemented as a current source. The circuit 120 may be implemented as a transconductance amplifier.

The voltage divider 114 may have an input biased by the supply voltage VCC. The voltage divider 114 may have an input connected to the ground voltage GND. The voltage divider 114 may present a signal (e.g., V1). The voltage divider 114 may be operational to present the signal V1 as a fraction or a portion of the supply voltage VCC with respect to the ground voltage GND.

The current source 118 may have an input biased by the supply voltage VCC. The current source 118 may have an input coupled to the ground voltage GND. The current source 118 may present a signal (e.g., IREF). The current source 118 may be operational to present the signal IREF as a constant current independent of variations in the supply voltage VCC with respect to the ground voltage GND.

The voltage amplifier 116 may have an input to receive the signal V1. The voltage amplifier 116 may have an input to receive the signal IREF. The voltage amplifier 116 may have an input coupled to the ground voltage GND. The voltage amplifier 116 may have an output to present a signal (e.g., V2). The voltage amplifier 116 may be operational to present the signal V2 as the signal V1 amplified. The voltage amplifier 116 may use the signal IREF as a constant current load.

The transconductance amplifier 120 may have an input to receive the signal V2. The transconductance amplifier 120 may have an input coupled to the ground voltage GND. The transconductance amplifier 120 may have an input coupled to the output 108 to receive a signal (e.g., IS). The transconductance amplifier 120 may be operational to sink the signal IS as a function of the signal V2. The signal IS may be drawn from the output of the pre-drive inverter 16 (e.g., from a node 122).

The pre-drive inverter 16 generally includes a CMOS driver to present the signal G. The CMOS driver may comprise a p-channel transistor 124 and an n-channel transistor 126. The p-channel transistor 124 may be disposed between the supply voltage VCC and the node 122. The n-channel transistor 126 may be disposed between the node 122 and the ground voltage GND. A gate of the p-channel transistor and a gate of the n-channel transistor may be coupled together. The gates may receive the signal IN.

Figure 6:
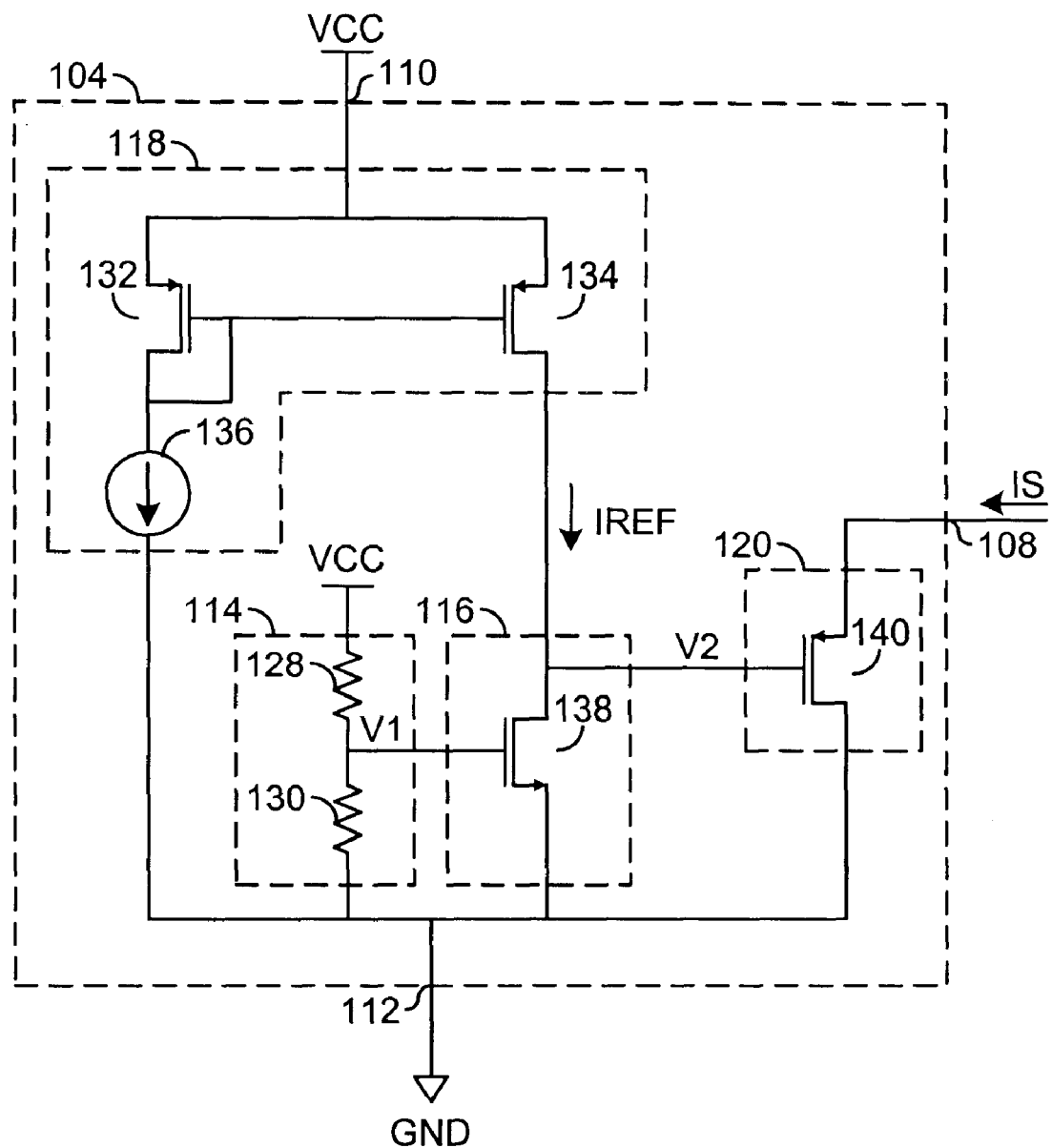
FIG. 6 is a schematic of the circuit.

Referring to FIG. 6, a schematic of the compensation circuit 104 is shown. The voltage divider 114 may comprise a first resistor 128 and a second resistor 130. The first resistor 128 may have a node biased to the supply voltage VCC and another node coupled to the second resistor 130. The second resistor 130 may have the node coupled to the first resistor 128 and another node biased to the ground voltage GND. A typical value for the first resistor 128 may be 10K ohms. A typical value for the second resistor 130 may be 5K ohms. Using the typical values, the signal V1 may be one-third the supply voltage VCC. Other values of the first resistor 128 and the second resistor 130 may be used to meet the design criteria of a particular implementation.

Other elements besides resistors may be used within the voltage divider 114. For example, one or both resistors may be replaced by diodes and/or transistors. A characteristic of the other devices may be to provide a nonlinear relationship between the signal V1 and the supply voltage VCC. Such an approach may be useful where the transfer characteristics of the pre-drive inverters 16A–B are a nonlinear function of the supply voltage VCC.

The current source 118 may be implemented as a current mirror circuit. The current mirror circuit generally comprises a transistor 132, a transistor 134, and a constant current source 136. The transistor 132 and the transistor 134 may be implemented as p-channel enhancement type field effect transistors. Other types of transistors may be used in accordance with the design criteria of a particular implementation.

The transistor 132 may have a source node connected to the input 110 to receive the supply voltage VCC. The transistor 132 may have a drain node connected to the constant current supply 136. The transistor 132 may have a gate node coupled to the drain node.

The transistor 134 may have a source node coupled to the input 110 to receive the supply voltage VCC. The transistor 134 may have a gate node coupled to the gate node of the transistor 132. The transistor 134 may have a drain node coupled to the voltage amplifier 116 to present the signal IREF.

The voltage amplifier 116 may comprise a transistor 138. The transistor 138 may be implemented as an n-channel enhancement type field effect transistor. Other types of transistors may be used in accordance with the design criteria of a particular implementation.

The transistor 138 may be arranged in a common-source configuration. The transistor 138 may have a drain node coupled to the current source 118 to receive the signal IREF. The signal IREF may act as a load for the transistor 138. The transistor 138 may have a gate node coupled to the voltage divider 114 to receive the signal V1. The transistor 138 may have a source node biased to the ground voltage GND. The drain node of the transistor 138 may also be coupled to the transconductance amplifier 120 to present the signal V2.

The transconductance amplifier 120 may be implemented as a transistor 140. The transistor 140 may be implemented as a p-channel enhancement type field effect transistor. Other types of transistors may be implemented in accordance with the design criteria of a particular implementation.

The transistor 140 may be arranged in a pull-down configuration. The transistor 140 may have a source node coupled to the output 108 to receive the signal IS. The transistor 140 may have a gate node coupled to the voltage amplifier 116 to receive the signal V2. The transistor 140 may have a drain node biased to the ground voltage GND.

The compensation circuit 104 may be designed to operate with a minimum value for the supply voltage VCC. The current source 118, voltage divider 114, and voltage amplifier 116 may be configured such that the signal V2 is approximately one threshold voltage below the signal G with respect to the ground voltage GND at the minimum value for the supply voltage VCC. As a result, the transistor 140 may be in an off state. In one embodiment, the signal V2 may be set such that the transistor 140 may be in a conducting state with the transistor 140 nonsaturated. The signal IS may therefore be minimal or zero amps. In other words, little to no compensation may be provided to the pre-drive inverter 16 at the minimum value for the supply voltage VCC.

As the signal VCC increases from the minimum value, the signal V1 may increase as well. As the signal V1 increases, the transistor 138 generally pulls the signal V2 closer to the ground voltage GND. The decreasing signal V2 may cause the transistor 140 to increase conductance. As a result, the signal IS conducted (sinked) by the transistor 140 may increase in amplitude.

Figure 7:
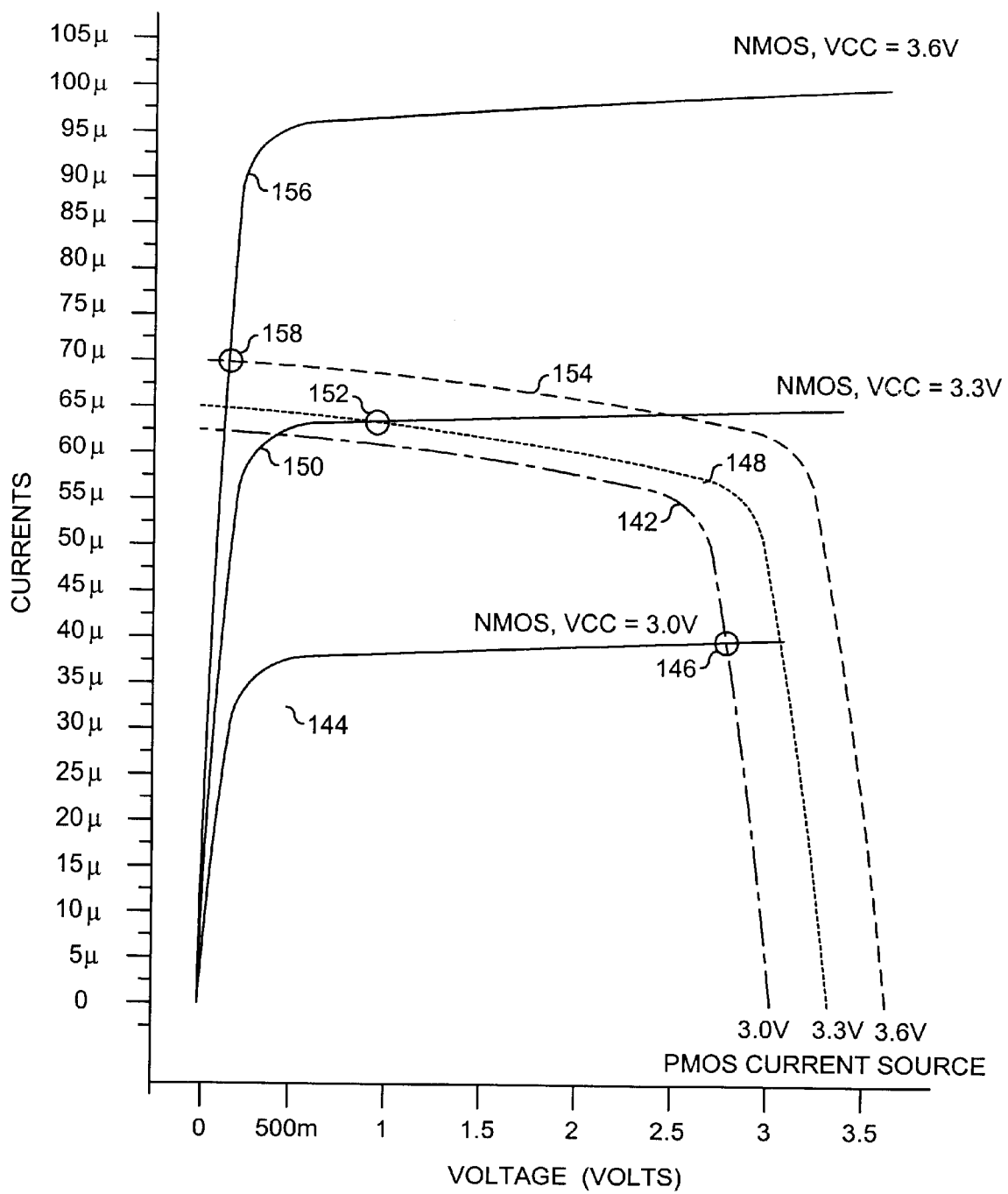
FIG. 7 is a graph of the current-voltage characteristics for an amplifier within the circuit.

Referring to FIG. 7, the current-voltage characteristics for transistor 134 and the transistor 138 are shown. Curve 142 represents the drain current of the transistor 134 when the supply voltage VCC is at 3.0 volts. Curve 144 represents the drain current of the transistor 138 and the supply voltage VCC is at 3.0 volts. A curve 142 and a curve 144 intersect at a point 146. The point 146 represent the signal V2 at approximately 2.65 volts with respect to the ground voltage GND.

While the supply voltage VCC is at 3.3 volts, a curve 148 represents the current through transistor 134 and a current 150 represents the drain current through transistor 138. The curve 148 and the curve 150 intersect at a point 152. The point 152 represents the signal V2 at approximately 0.89 volts.

While supply voltage VCC is at 3.6 volts, a curve 154 represents the drain current through the transistor 134 and a curve 156 represents the drain current through the transistor 138. The curve 154 and the curve 156 intersect at a point 158. The point 158 represents the signal V2 at approximately 0.21 volts with respect to the ground voltage GND.

The effects of the signal V2 on the crossing point of the pre-drive inverters 16A–B may be to minimize or eliminate a change in the crossing point. Examples of an HSpice simulation of the circuit 100 and a bench measurement of the circuit 100 with and without crossing point compensation is generally shown in TABLE 1. The results of the HSpice simulation and the bench measurement generally indicate that changes in the crossing point due to variations in the supply voltage VCC may be reduced by the compensation circuits 104A–B.

TABLE 1

|  | HSpice Simulation Results (mV) | | Bench Measurement Results (mV) | |
|---|---|---|---|---|
| Crossing Point Compensation | Yes | No | Yes | No |
| 3.6 V | 657 | 706 | 598 | 668 |
| 3.3 V | 617 | 644 | 588 | 603 |
| 3.0 V | 559 | 563 | 519 | 512 |
| Δ Crossing Point | 98 | 143 | 79 | 156 |

The compensation circuit 104 has been described in the examples above as having a current sinking capability. It will be apparent to one of ordinary skill in the art that the compensation circuit 104 may be modified to provide a current sourcing capability. The current sourcing type of compensation circuit 104 may be applied in designs where the crossing point of the pre-drive inverter 16 decreases as the supply voltage VCC increases. By sourcing additional current (e.g., signal IS) into the drain of the n-channel transistor 126 of the pre-drive inverter 16, the drain-to-source voltage drop across the transistor 126 (e.g., signal G) may increase. A relationship between the signal IS and the supply voltage VCC may be implemented such that the increase drain-to-source voltage drop may compensate for the uncompensated decrease in the crossing point of the pre-drive inverter 16.

It will be apparent to those skilled in the relevant art(s) that certain nodes of transistors and other semiconductor devices may be interchanged and still achieve the desired electrical characteristics. The node interchanging may be achieved physically and/or electrically. Examples of transistor nodes that may be interchanged include, but are not limited to, the emitter and collector of bipolar transistors, the drain and source of field effect transistors, and the first base and second base of unijunction transistors.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a current source configured to present a reference current;
   a voltage divider configured to divide a supply voltage to present a first voltage;
   a first amplifier configured to (i) receive said reference current as a load, (ii) receive said first voltage, and (iii) present a second voltage responsive to said first voltage;
   a second amplifier configured to (i) receive said second voltage and (ii) change a current at a node responsive to said second voltage; and
   a pull-up transistor coupled between said node and said supply voltage.

2. The circuit according to claim 1, further comprising a pull-down transistor coupled between said node and a ground voltage.

3. The circuit according to claim 2, wherein said pull-up transistor and said pull-down transistor are configured as a CMOS driver to present a signal at said node.

4. The circuit according to claim 3, wherein said current source, said voltage divider, said first amplifier, and said second amplifier are configured to compensate for variations in a crossing point of said CMOS driver as said supply voltage varies.

5. An apparatus comprising:
   a first circuit according to claim 1;
   a second circuit configured identical as said first circuit;
   an output current source configured to present an output current;
   a first output transistor configured to direct a first portion of said output current responsive to said current changed by said first circuit; and
   a second output transistor configured to direct a second portion of said output current responsive to said current changed by said second circuit.

6. The circuit according to claim 1, wherein said current source is a branch of a current mirror.

7. The circuit according to claim 6, wherein said first amplifier is a first transistor in a common-source configuration.

8. The circuit according to claim 7, wherein said second amplifier is a second transistor in a pull-down configuration.

9. The circuit according to claim 8, further comprising:
a first resistor coupled between a supply voltage and a gate of said first transistor; and
a second resistor coupled between said gate of said first transistor and a ground voltage.

10. A method of compensating for variations in a supply voltage comprising the steps of:
(A) presenting a reference current from a current source;
(B) dividing a supply voltage to present a first voltage;
(C) amplifying said first voltage to present a second voltage using said reference current as a load;
(D) amplifying said second voltage to change a current at a node; and
(E) driving said node toward said supply voltage with a pull-up transistor.

11. The method according to claim 10, further comprising the step of driving said node toward a return for said supply voltage with a pull-down transistor.

12. The method according to claim 11, wherein said pull-up transistor and said pull-down transistor are configured as a CMOS driver to present a signal at said node.

13. The method according to claim 12, wherein changing said current at said node compensates for variations in a crossing point of said CMOS driver as said supply voltage varies.

14. The method according to claim 12, further comprising the steps of:
producing an output current; and
directing a portion of said output current in response to said signal.

15. A circuit comprising:
means for presenting a reference current from a current source;
means for dividing a supply voltage to present a first voltage;
means for amplifying said first voltage to present a second voltage using said reference current as a load;
means for amplifying said second voltage to change a current at a node; and
means for driving said node toward said supply voltage.

* * * * *